United States Patent [19]
Song

[11] Patent Number: 6,151,612
[45] Date of Patent: Nov. 21, 2000

[54] APPARATUS AND METHOD FOR CONVERTING FLOATING POINT NUMBER INTO INTEGER IN FLOATING POINT UNIT

[75] Inventor: Yoon Seok Song, Kyoungki-do, Rep. of Korea

[73] Assignee: Hyundai Electronics Industries Co., Ltd., Ichon-shi, Rep. of Korea

[21] Appl. No.: 09/074,601

[22] Filed: May 8, 1998

[30] Foreign Application Priority Data

May 9, 1997 [KR]  Rep. of Korea ..................... 97-18012

[51] Int. Cl.$^7$ ....................................................... G06F 5/00
[52] U.S. Cl. ............................................................ 708/204
[58] Field of Search ................................. 708/204, 495; 341/50

[56] References Cited

U.S. PATENT DOCUMENTS

| | | | |
|---|---|---|---|
| 4,338,675 | 7/1982 | Palmer et al. .......................... | 364/748 |
| 5,257,215 | 10/1993 | Poon ...................................... | 708/204 |
| 5,561,615 | 10/1996 | Kuo et al. .............................. | 708/204 |
| 5,619,198 | 4/1997 | Blackham .............................. | 708/204 |
| 5,764,548 | 8/1998 | Keith et al. ............................ | 708/204 |
| 5,905,663 | 5/1999 | Nash ...................................... | 708/204 |

FOREIGN PATENT DOCUMENTS 3-67328  3/1991  Japan .

*Primary Examiner*—David H. Malzahn
*Attorney, Agent, or Firm*—Jacobson, Price, Holman & Stern, PLLC

[57] ABSTRACT

The present invention relates to an apparatus and a method for converting the binary floating point number into a integer represented as binary numbers of fixed length, the method for converting the binary floating point number into a integer comprising: calculating an exponent difference between the floating point number as a first operand and a constant which has a fraction of '0' value and an exponent of 'data sizes of the integer-1' value as a second operand, shifting the fraction of the operand having the smaller exponent as many as the exponent difference, and outputting a bigger exponent; adding the fraction of the operand having the bigger exponent and a selected fraction, wherein the a selected fraction is in case of a negative value, the shifted fraction which is complemented to one, in case of a positive value, the shifted fraction itself in response to a sign of the first operand; and outputting the bigger exponent as a final result of the exponent, outputting and rounding the added fraction in response to a control signal as the final result of the fraction.

13 Claims, 2 Drawing Sheets

S : 0 : positive Sign
   1 : negative Sign

E : Exponent (Bias : 3fffh)

F : Fraction (1. xxxxx ······ xxxx)

▲ : Binary Point

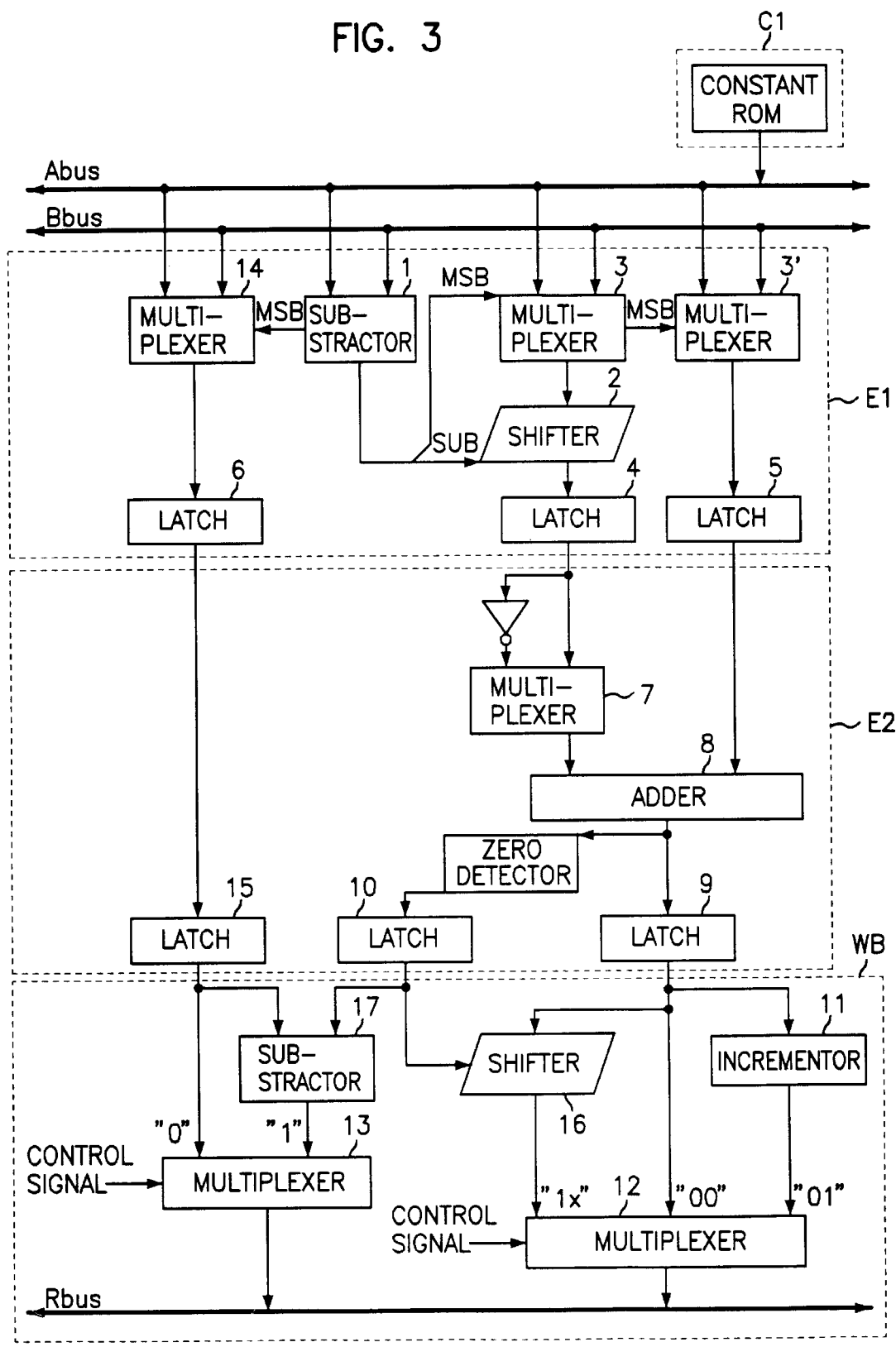

APPARATUS AND METHOD FOR CONVERTING FLOATING POINT NUMBER INTO INTEGER IN FLOATING POINT UNIT

BACKGROUND OF THE INVENTION

1. Field of the Invention

The present invention relates to a floating point operation, and more particularly, to an apparatus and method for converting a binary floating point number into a binary integer.

2. Description of the Related Art

Generally, a floating point operation conforms to IEEE 754 standard. FIG. 1 is a diagram illustrating an 80-bit double extended precision format for the binary floating number and FIG. 2 is a diagram illustrating a 64-bit integer format.

As shown in FIG. 1, the binary floating point number is characterized by three fields: a sign 100, an exponent 110 and a fraction 120. The fraction 120 of the binary floating point number is represented as 64 bits such as 1.xxxxx . . . xxxx. The binary point of the binary floating point number must be shifted right for conversion of the binary floating point number into the binary integer. That is, a fraction of the binary floating point number must be shifted right by 63 bits, and then an exponent value of the binary floating number increases by an exponent value of '63'.

Also, the exponent value of the binary floating point number must not be a negative number. Accordingly, the binary point of the binary floating number is shifted until the exponent value of the binary floating point number is '0'.

A conversion of a binary floating point number of '1.11110000 . . . 000.*$2^2$' as a decimal point number of 7.75 into a binary integer is described below.

1) If the binary point of the binary floating point number is shifted right by 63 bits, the binary floating point number is represented as '1111100000 . . . 000.*$2^{2-63}$=1111100000 . . . .000.+$2^{-61}$'.

2) The fraction of the binary floating point number is shifted right by 61 bits until the exponent value of the binary floating point number is '0'. Then, the binary floating point number is represented as '000000 . . . 0111.11*$2^0$'.

3) If a bit value of '.11' below the binary point is rounded, the binary floating point number is represented as '000000 . . . 1000.*$2^0$'.

The binary integer of '000000 . . . 1000.*$2^0$' obtained through 3 steps equals a result where the fraction of the binary floating point number is shifted right by 61 bits and a bit value below the binary point is rounded. As the number of '61' is obtained by subtracting '2' from '63', the binary floating point number needs the right-shifting of 63-N bits where N is an exponent value of a binary floating point number and a positive number. If N is above 64, an overflow is caused because the floating point number isn't represented as a 64-bit integer. There was a problem that a conventional apparatus for converting the binary floating point number into the binary integer needs a complicated hardware or complicated control circuits.

SUMMARY OF THE INVENTION

It is, therefore, an object of the present invention to provide an apparatus and method for effectively converting a binary floating point number into a binary integer by using a floating point unit as a microprocessor unit (MPU).

In accordance with an aspect of the present invention, there is provided a method, for use in a microprocessor unit (MPU), for converting a binary floating point number to a binary integer, comprising the steps of: a) storing a constant as a first operand having a fraction value of 0 and an exponent value of N−1 where N is a positive integer as the number of bits corresponding to the binary integer; b) loading the first operand and a second operand having a fraction value and an exponent value as the binary floating point number on a data bus; c) generating a difference value between the exponent value of N−1 contained in the first operand and the exponent value contained in the second operand loaded on the data bus; d) selecting a fraction having the fraction value of the second operand loaded on the data bus; e) shifting the fraction of the second operand right by the number of bits corresponding to the difference value; and f) rounding a bit value below a binary point contained in the fraction of the second operand shifted, thereby converting the second operand to the binary integer.

In accordance with another aspect of the present invention, there is provided an apparatus for converting a binary floating point number into a binary integer, comprising: a storage means for storing a constant as a first operand having a fraction value of 0 and an exponent value of N−1 where N is a positive integer as the number of bits corresponding to the binary integer; a data bus for loading the first operand and a second operand having a fraction value and an exponent value as the binary floating point number; a generation means for generating a difference value between the exponent value of N−1 contained in the first operand and the exponent value contained in the second operand loaded on said data bus; a selection means for selecting a fraction having the fraction value of the second operand loaded on said data bus; a shifting means for shifting the fraction of the second operand right by the number of bits corresponding to the difference value; and a rounding means for rounding a bit value below a binary point contained in the fraction of the second operand shifted, thereby converting the second operand to the binary integer.

BRIEF DESCRIPTION OF THE DRAWINGS

Other objects and aspects of the present invention will become apparent from the following description of the embodiments with reference to the accompanying drawings, in which:

FIG. 3 is a block diagram illustrating an apparatus for converting a binary floating point number into a binary integer in accordance with the present invention.

DETAILED DESCRIPTION OF THE PREFERRED EMBODIMENT

Figure 1:
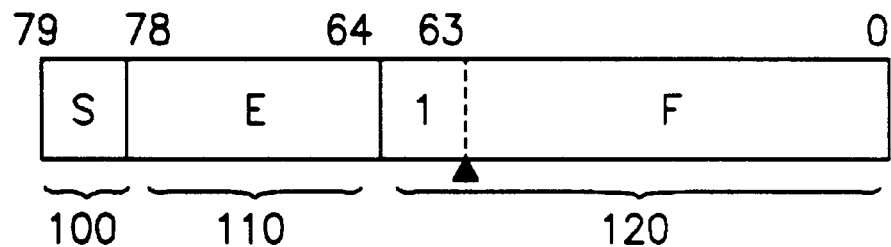
FIG. 1 is a diagram illustrating an 80-bit double extended precision format for a binary floating point number.
Figure 2:
FIG. 2 is a diagram illustrating a 64-bit integer format.

Hereafter, the present invention will be described in detail with reference to the accompanying drawings.

A conversion of a binary floating point number to a binary integer in accordance with the present invention is implemented without an additional hardware through a data path for addition arithmetic and subtraction arithmetic in a floating point unit.

In order to convert the binary floating point number to the binary integer at the addition arithmetic, a shifter shirts a fraction contained in the binary floating point number by 63-N bits corresponding to a difference value between exponent values of both operands, wherein N is an exponent value of the binary floating point number and a positive number. The exponent value of a second operand for the addition arithmetic has to be '63'. A fraction of the second operand has '0'. Namely, the second operand for the addition arithmetic is 0.0000 . . . 00000*$2^{63}$ and a first operand is the binary floating point number to be converted to the binary integer. The conversion of the first operand to be converted to the binary integer by adding the first operand to the second operand is automatically performed.

However, one different thing from the conventional addition arithmetic is that although the addition result is normalized for a most significant bit (hereinafter referred to as an MSB) to be '1' in the conventional addition arithmetic, this normalization must not be performed because the binary point in the conversion process is moved to a least significant bit (hereinafter referred to as an LSB) in the present invention. That is, the result itself of the addition arithmetic becomes the binary integer.

FIG. 3 is a block diagram illustrating an apparatus for converting a binary floating point number into a binary integer in accordance with the present invention.

First of all, two operands for the addition arithmetic are loaded on A and B buses at a first stage E1. A constant corresponding to '0x$2^{63}$' is saved in a constant ROM C1. The constant is loaded on the A bus, and the binary floating point number to be converted is loaded on the B bus. A subtractor 1 generates a difference value between exponent values of the two operands by subtracting an exponent value or the constant as a second operand from an exponent value of the floating point number as a first operand. Also, a multiplexer 3 selects a fraction of the first operand having a smaller exponent value than the exponent value of the second operand in response to the difference value between the exponent values of the two operands. A shifter 2 shifts the fraction or the first operand right by the number of bits corresponding to the difference value between the exponent value between the exponent values of the two operands. A latch 4 latches the fraction of the first operand shifted.

A fraction or the second operand having a bigger exponent value than the exponent value of the first operand is saved at a latch 6 without shifting. In the conversion operation of a typical range, the fraction of the floating point number, which is inputted from the B bus, to be converted is inputted into the latch 4, and the fraction of the constant, namely '0', which is loaded on the A bus, is inputted into a latch 5. Also, a hexadecimal number of '403e' as the exponent value of the constant loaded on the A bus is selected by a multiplexer 14 and saved at the latch 6. The hexadecimal number or '403e' is the exponent value of '63' plus a bias value of '3fff' in case that an exponent is made up of 15 bits.

At a second stage E2, where the floating point number to be converted is a negative number, the shifted fraction outputted from the latch 4 is outputted from a multiplexer 7 after taking a 1's complement value of the shifted fraction. Where the binary floating point number to be converted is a positive number, the shifted fraction is outputted from the multiplexer 7. The 1's complement value of the shifted fraction is changed to a 2's complement value by an adder 8. Where the binary floating point number to be converted is the positive number, a latch 9 saves the shifted fraction. Further, where the binary floating point number to be converted is the negative number, the latch 9 saves the 2's complement value of the shifted fraction. A latch 10, which needs to save the number of 0's counted from an MSB through a zero detector in order to normalize the result of the addition or subtraction arithmetic outputted from the adder 8 is not used at the conversion operation of the present invention. And, a hexadecimal number of '63+3fff', as the exponent value of the constant saved at the latch 6, is again saved at a latch 15.

At a third stage WB, in. case of needing to round data stored at the latch 9, a rounded fraction outputted from an incrementor 11, which increments the data stored at the latch 9 by '1', is transferred to an R bus through a multiplexer 12. In case of needing not to round the data, the fraction stored at the latch 9 is outputted to the R bus through the multiplexer 12. Other input of the multiplexer 12 is selected when the result of the addition or subtraction arithmetic normalized is outputted. And, a multiplexer 13 outputs the exponent value stored at a latch is in response to a control signal to the R bus. That is, the hexadecimal number of '63+3fff' is outputted to the R bus.

An example of a conversion of the binary floating point number of '1.11110000 . . . 000*$2^2$' into the binary integer is described below.

The constant of '0*$2^{63}$' as an operand is loaded on the A bus at the first stage E1 and the binary floating point number of '1.11110000 . . . 000*$2^2$' as another operand is loaded on the B bus. The exponent difference between both operands generated by the subtractor 1 is '61'. And, the fraction of the binary floating point number of '1.11110000 . . . 000' is selected by the multiplexer 3 and the fraction of the binary floating point number of '000000 . . . 0111.11' shifted by 61 bits is saved at the latch 4. And, the fraction of the constant, '0' selected by the multiplexer 3' is saved at the latch 5. Also, the exponent value of the constant, '63' selected by the multiplexer 14 is saved at the latches 6 and 15. At the second stage E2, the shifted fraction, '000000 . . . 0111.11', saved at the latch 4 is selected by the multiplexer 7 and the shifted fraction is inputted into the adder 8. The adder 8 adds '000000 . . . 0111.11' and '0' saved in the latch 5. The addition result is saved at the latch 9. At the third stage WB, a fraction, '000000 . . . 1000', rounded by the incrementor 11, is outputted to the R bus and selected by the multiplexer 12. And the exponent value of '63' selected by the multiplexer 13 is outputted to the R bus. The binary floating point number of '1.11110000 . . . 000*$2^2$' is converted to the binary integer number of '000000 . . . 1000' through the conversion process described above.

The method of converting the binary floating point number to the binary integer in accordance with the present invention is applicable to a microcontroller processing the floating point number and the floating point unit of the MPU.

According to the present invention, as described above, the size of the floating point unit performing the conversion of the floating point number to the binary integer using a resource only for the addition or subtraction arithmetic without the additional hardware is reduced. Also, as the apparatus of the present invention is made up of a pipelined circuit, a latency is '3' but a throughput becomes '1'. Accordingly, the apparatus of the present invention has a better performance than the conventional apparatus having an additional hardware.

Although the preferred embodiment of the present invention has been disclosed for illustrative purpose, those skilled in the art will appreciate that various modifications, additions and substitutions are possible, without departing from the scope and spirit of the present invention as disclosed in the accompanying claims.

What is claimed is:

1. A method, for use in a microprocessor unit (MPU), for converting a binary floating point number to a binary integer, comprising the steps of:

a) storing a constant as a first operand having a fraction value of 0 and an exponent value of N−1 where N is a positive integer as the number of bits corresponding to the binary integer;

b) loading the first operand and a second operand having a fraction value and an exponent value as the binary floating point number on a data bus;

c) generating a difference value between the exponent value of N−1 contained in the first operand and the exponent value contained in the second operand loaded on the data bus;

d) selecting a fraction having the fraction value of the second operand loaded on the data bus;

e) shifting the fraction of the second operand right by the number of bits corresponding to the difference value; and f) rounding a bit value below a binary point contained in the fraction of the second operand shifted, thereby converting the second operand to the binary integer.

2. The method as recited in claim 1, wherein said step f) includes the steps of:

f1) selecting a fraction having the fraction value of the first operand loaded on the data bus;

f2) adding the fraction having the fraction value of 0 contained in the first operand to the fraction of the second operand shifted; and f3) rounding the bit value below the binary point contained in the fraction of the second operand shifted.

3. The method as recited in claim 1, wherein the constant is stored in a read-only memory (ROM) device.

4. The method as recited in claim 1, wherein the N is 64.

5. The method as recited in claim 1, wherein a data format of the binary floating point number includes a double extended precision format.

6. An apparatus for converting a binary floating point number into a binary integer, comprising:

a storage means for storing a constant as a first operand having a fraction value of 0 and an exponent value of N−1 where N is a positive integer as the number of bits corresponding to the binary integer;

a data bus for loading the first operand and a second operand having a fraction value and an exponent value as the binary floating point number;

a generation means for generating a different value between the exponent value of N−1 contained in the first operand and the exponent value contained in the second operand loaded on said data bus;

a selection means for selecting a fraction having the fraction value of the second operand loaded on said data bus;

a shifting means for shifting the fraction of the second operand right by the number of bits corresponding to the difference value; and a rounding means for rounding a bit value below a binary point contained in the fraction of the second operand shifted, thereby converting the second operand to the binary integer.

7. The apparatus as recited in claim 6, further comprising:

a second selection means for selecting a fraction having the fraction value of the first operand loaded on said data bus; and an addition means for adding the fraction having the fraction value of 0 contained in the first operand to the fraction of the second operand shifted.

8. The apparatus as recited in claim 7, wherein said selection means and said second selection means include a multiplexer, respectively.

9. The apparatus as recited in claim 6, wherein said storage means includes a read-only memory (ROM) device.

10. The apparatus as recited in claim 6, wherein said generation means includes a subtractor.

11. The apparatus as recited in claim 6, wherein said rounding means includes an incrementor.

12. The apparatus as recited in claim 6, wherein the N is 64.

13. The apparatus as recited in claim 6, wherein a data format of the binary floating point number includes a double extended precision format.

* * * * *